(12) United States Patent
Chaji et al.

(10) Patent No.: US 12,550,494 B2
(45) Date of Patent: Feb. 10, 2026

(54) MICRO OPTOELECTRONIC DEVICE

(71) Applicant: VueReal Inc., Waterloo (CA)

(72) Inventors: Gholamreza Chaji, Waterloo (CA); Ehsanollah Fathi, Waterloo (CA); Hossein Zamani Siboni, Waterlooo (CA)

(73) Assignee: VueReal Inc., Waterloo (CA)

( * ) Notice: Subject to any disclaimer, the term of this patent is extended or adjusted under 35 U.S.C. 154(b) by 59 days.

(21) Appl. No.: 18/006,279

(22) PCT Filed: Jul. 22, 2021

(86) PCT No.: PCT/CA2021/051019
§ 371 (c)(1),
(2) Date: Jan. 20, 2023

(87) PCT Pub. No.: WO2022/016282
PCT Pub. Date: Jan. 27, 2022

(65) Prior Publication Data
US 2023/0261146 A1 Aug. 17, 2023

Related U.S. Application Data

(60) Provisional application No. 63/055,121, filed on Jul. 22, 2020.

(51) Int. Cl.
*H10H 20/84* (2025.01)
*H10H 20/816* (2025.01)
(Continued)

(52) U.S. Cl.
CPC ........ *H10H 20/84* (2025.01); *H10H 20/8162* (2025.01); *H10H 20/8312* (2025.01); *H10H 20/833* (2025.01); *H10H 20/835* (2025.01)

(58) Field of Classification Search
CPC ............... H10H 20/84; H10H 20/8162; H10H 20/8312; H10H 20/833; H10H 20/835; H10H 20/8316; H10F 77/223
See application file for complete search history.

(56) References Cited

U.S. PATENT DOCUMENTS 7,315,115 B1 1/2008 Curtin et al.
7,902,670 B2 3/2011 Lin et al.
(Continued)

FOREIGN PATENT DOCUMENTS

| TW | I258794 B | 7/2006 |
| TW | 201218349 A | 5/2012 |
| WO | 2019202258 A2 | 10/2019 |

OTHER PUBLICATIONS

WIPO: PCT International Search Report and Written Opinion relating to PCT application No. PCT/CA2021/051019, dated Oct. 28, 2021.

(Continued)

*Primary Examiner* — Su C Kim

(57) ABSTRACT

The present invention discloses a different option electronic devices with their structure so layers that include doping, function, ohmic, conductive, planarization and passivation layer. The invention also discloses configuration of connections of top and bottom sides comprising isolated structures, related electrodes and height configuration of isolated structures.

22 Claims, 5 Drawing Sheets

(51) Int. Cl.
*H10H 20/831* (2025.01)
*H10H 20/832* (2025.01)
*H10H 20/833* (2025.01)

(56) References Cited

U.S. PATENT DOCUMENTS

| | | | | |
|---|---|---|---|---|
| 10,304,977 | B1* | 5/2019 | Okandan | H10F 77/315 |
| 2009/0314346 | A1* | 12/2009 | Hishida | H01L 31/0747 |
| | | | | 136/258 |
| 2010/0218816 | A1* | 9/2010 | Guha | H10F 10/146 |
| | | | | 438/98 |
| 2011/0005582 | A1* | 1/2011 | Szlufcik | H01L 31/02245 |
| | | | | 257/E31.113 |
| 2015/0002752 | A1 | 1/2015 | Seyedmohammedi et al. | |
| 2015/0027524 | A1* | 1/2015 | Seyedmohammadi | ...................... |
| | | | | H01L 31/02167 |
| | | | | 252/514 |
| 2018/0315738 | A1 | 11/2018 | Bono et al. | |
| 2019/0221702 | A1* | 7/2019 | Fujita | H01L 31/202 |

OTHER PUBLICATIONS

Taiwan (ROC): TW Office Action relating to TW application No. 110127002 May 8, 2025.

* cited by examiner

MICRO OPTOELECTRONIC DEVICE

FIELD OF THE INVENTION

The present invention relates to a structure of a micro optoelectronic device having a number of layers. Where the structure helps to reduce the effect of non-idealities such as defects to improve the device performance.

SUMMARY

The present invention relates to a vertical optoelectronic device, the device comprising, doped and blocking layers, a functional layer, the doped, blocking and functional layers etched on isolated structures; the isolated structures comprising in part of ohmic layers; the isolated structures being located on top and bottom of the device; dielectric layers deposited to cover at least a side of isolated structures; conductive layers on open areas of the isolated structures; and passivation layers formed to fill a surface of the optoelectronic device.

BRIEF DESCRIPTION OF THE DRAWINGS

The foregoing and other advantages of the disclosure will become apparent upon reading the following detailed description and upon reference to the drawings.

Figure 1:
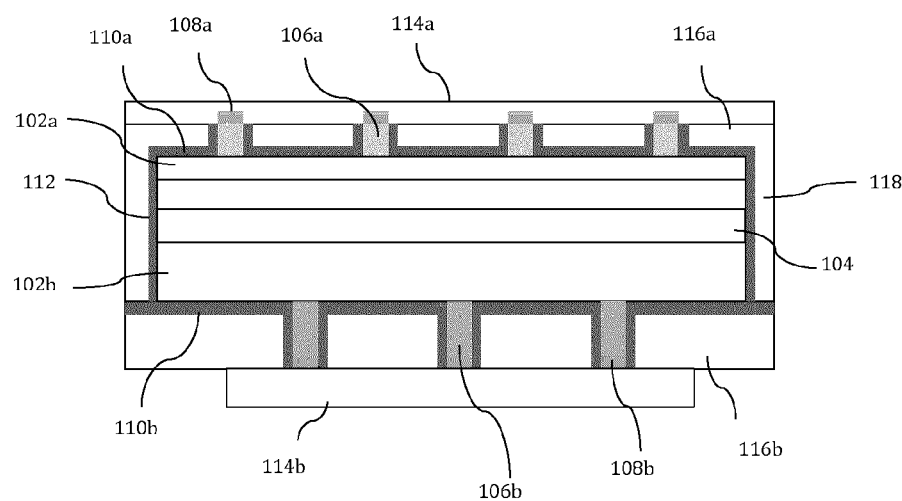
FIG. 1 shows an optoelectronic device with a layered structure having isolated structures.

While the present disclosure is susceptible to various modifications and alternative forms, specific embodiments or implementations have been shown by way of example in the drawings and will be described in detail herein. It should be understood, however, that the disclosure is not intended to be limited to the particular forms disclosed. Rather, the disclosure is to cover all modifications, equivalents, and alternatives falling within the spirit and scope of an invention as defined by the appended claims.

DETAILED DESCRIPTION

The present invention relates to a structure of a micro optoelectronic device having a number of layers such as doped, blocking and functional layers. The terms "microdevice" and "optoelectronic device" are used interchangeably.

According to one embodiment of the invention as shown by FIG. 1 there is a vertical micro optoelectronic device 100 comprising different layers such as doped and blocking layers 102a and 102b, and functional layer 104 where the current passing through layers is confined through some isolated layers and common electrodes on top of a planarized layer connect to the isolated layers.

Some of the layers can be etched into isolated areas 106a, and 106b. Ohmic layers 108a, and 108b can be part of the isolated structures 106a, and 106b.

The isolation structures can be on both top or bottom sides (or only one side).

Dielectric layers 110a and 110b can be deposited to cover at least the side of isolated areas 106a, and 106b. The dielectric layers 110a and 110b can cover the side of the layers 112.

Conductive layers 114a and 114b can be deposited after at least a part of the top of the isolated areas 106a, and 106b is open. Passivation layers 116a, and 116b can be formed to fill the surface of the device. Either of the passivation layers 116a or 116b can cover the side 118 of the device.

In one method the isolated layers are formed before the main structure is formed for the microdevice. In another case, the isolated layers are formed after the device is developed. Treatment process can be done to remove some of the defects on the sidewalls and surface between the isolated layers (and or the sidewalls of the main structure). A dielectric is deposited on to cover the area between the isolated layers or sidewall of the isolated areas. A planarization layer is deposited on the surface. The planarization layer is patterned or etched back to expose the top of the isolated layers. The dielectric layer can be removed from the top if it is not already. A common electrode is formed on top of the planarization layer.

In another embodiment, at least one of the isolated layers is connected to a different electrode. The electrode is biased to a different bias point compared to the common electrode. In some operation conditions, the two electrodes can have the same bias points. For example, for lower current density, one of said electrodes can be biased so that some of the isolated layers have no current passing through them.

Figure 2:
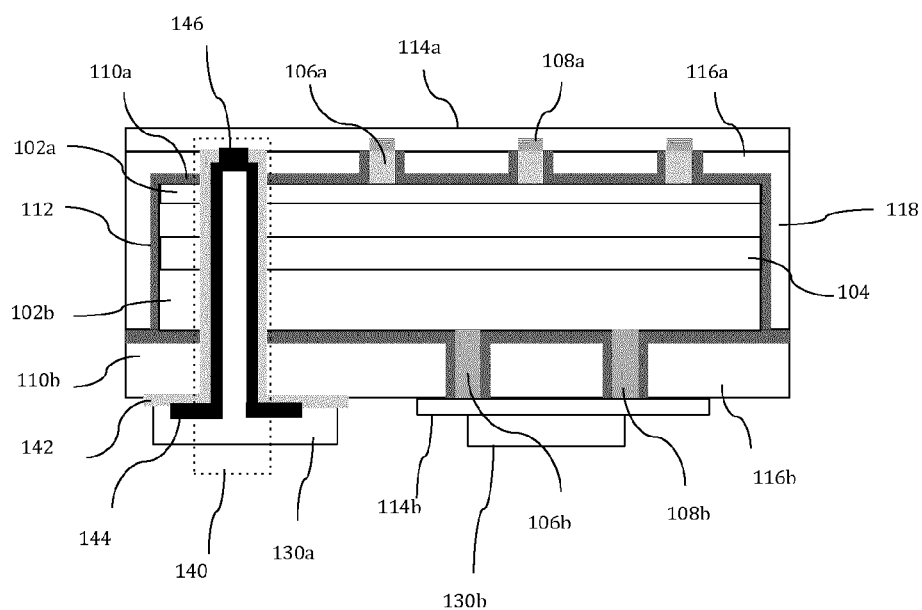
FIG. 2 shows an optoelectronic device with a layered structure having isolated structures with a VIA.

According to one embodiment as shown by FIG. 2 there is a micro optoelectronic device 100 comprising different layers such as doped and blocking layers 102a and 102b, and functional layers 104 where the current passing through layers is confined through some isolated layers and common electrodes on top of a planarized layer connected to the isolated layers. And one of the common electrodes is coupled to the other side through a VIA formed in the functional layer and planarization layer.

Some of the layers can be etched into isolated areas 106a, 106b. Ohmic layers 108a, and 108b can be part of the isolated structures 106a, and 106b.

The isolation structure can be on both top or bottom sides (or only one side).

Dielectric layers 110a and 110b can be deposited to cover at least the side of isolated areas 106a, and 106b. The dielectric layers 110a and 110b can cover the side of the layers 112.

Conductive layers/electrodes 114a, and 114b can be deposited after at least a part of the top of the isolated areas 106a, and 106b is open. Passivation layers 116a, and 116b can be formed to fill the surface of the device. Either of the passivation layers 116a or 116b can cover the side 118 of the device.

A VIA 140 is formed to couple a conductive layer 144 with the electrode 114a. A dielectric layer 142 is covering the sidewall of the VIA 140. An opening 146 in the dielectric 142 is formed to provide access to the electrode 114a.

Pads 130b and 130a can form on the electrode 114b and conductive layer 144 respectively. The pads can be part of the electrode 114b or the conductive layer 144. The electrodes 114a and 114b can be transparent or reflective. The VIA 140 can be through the passivation covering the side 118.

In one method the isolated layers are formed before the main structure is formed for the microdevice. In another case, the isolated layers are formed after the device is developed. Treatment process can be done to remove some of the defects on the sidewalls and surface between the isolated layers (and or the sidewalls of the main structure). A dielectric is deposited on to cover the area between the isolated layers or sidewall of the isolated areas. A planarization layer is deposited on the surface. The planarization layer is patterned or etched back to expose the top of the isolated layers. The dielectric layer can be removed from the top if it is not already. A common electrode is formed on top of the planarization layer.

In an embodiment, at least one of the isolated layers is connected to a different electrode. The electrode is biased to a different bias point compared to the common electrode. In some operation conditions, the two electrodes can have the same bias points. For example, for lower current density, one of said electrodes can be biased so that some of the isolated layers have no current passing through them.

A VIA is formed to couple the electrodes to the other side of the device. The VIA is covered by dielectric and a conductive layer is formed to couple the electrode to the other side. There can be an opening in the dielectric layer. An etch stop of the cap layer can be formed on top of the VIA and opening (146).

Figure 3:
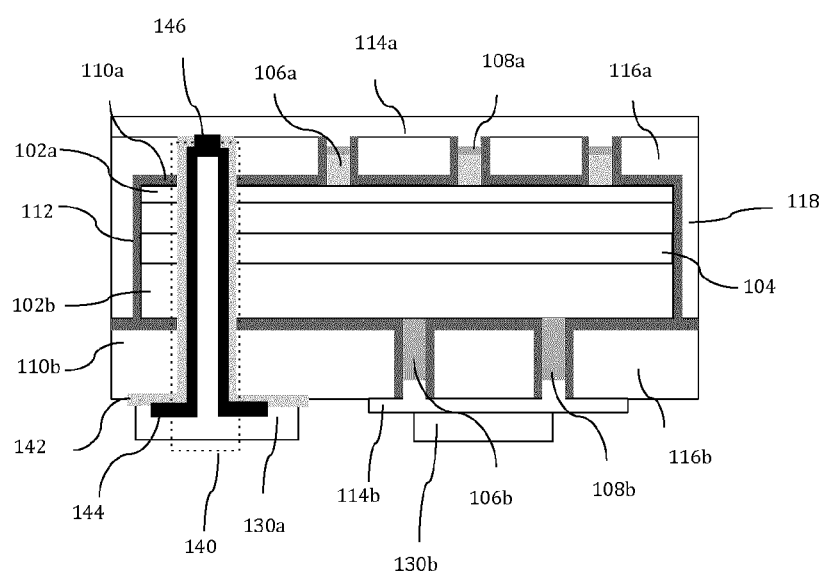
FIG. 3 shows an optoelectronic device with a layered structure having isolated structures with a VIA.

According to one embodiment as shown by FIG. 3 shows different implementations of common electrodes that can be applied to FIG. 2 or FIG. 1. There is a micro optoelectronic device 100 comprising different layers such as doped and blocking layers 102a and 102b, and functional layers 104. Here, the planarization is higher than the ohmic layers. As a result any pressure to the common electrodes or pads is not directly passed to the isolated layers and prevents damaging the isolated areas.

One case to develop the height difference is to form a thicker passivation layer than the isolation layers height pattern and pattern the planarization to create an opening in the planarization layer on top of the isolated areas.

In another case, there is a sacrificial layer on top of the isolation layer and after the planarization layer is formed, the sacrificial layer is removed and so creates a dip in the planarization layer on top of the isolated layer.

Some of the layers can be etched into isolated areas 106a, and 106b. Ohmic layers 108a, and 108b can be part of the isolated structures 106a, and 106b.

The isolation structure can be on both top or bottom sides (or only one side).

Dielectric layers 110a and 110b can be deposited to cover at least the side of isolated areas 106a, and 106b. The dielectric layers 110a and 110b can cover the side of the layers 112.

Conductive layers/electrodes 114a, and 114b can be deposited after at least a part of the top of the isolated areas 106a, and 106b is open. Passivation layers 116a, and 116b can be formed to fill the surface of the device. Either of the passivation layers 116a or 116b can cover the side 118 of the device.

A VIA 140 is formed to couple a conductive layer 144 with the electrode 114a. A dielectric layer 142 is covering the sidewall of the VIA 140. An opening 146 in the dielectric 142 is formed to provide access to the electrode 114a.

Pads 130b and 130a can form on the electrode 114b and conductive layer 144 respectively. The pads can be part of the electrode 114b or conductive layer 144. The electrodes 114a and 114b can be transparent or reflective.

In one embodiment, the passivation 116a or 116b are taller than the isolated areas 106a or 106b. In one case to produce the profile, a sacrificial layer is formed on top of the 108a, 108b. After the passivation layer 116a and 116b are formed the sacrificial layer is removed. This can remove the pressure from the isolated area during the integration of the microdevice 100 into a substrate.

The VIA 140 can be through the passivation covering the side 118.

Figure 4:
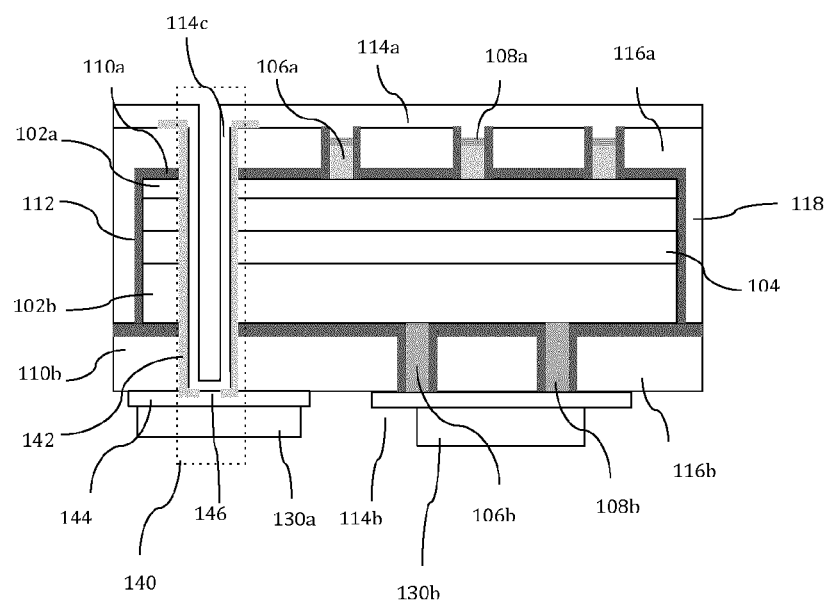
FIG. 4 shows an optoelectronic device with a layered structure having isolated structures with a VIA and conductive layer filling part of the VIA.

According to one embodiment as shown by FIG. 4 there is a micro optoelectronic device 100 comprising different layers such as doped and blocking layers 102a and 102b, and functional layers 104.

Some of the layers can be etched into isolated areas 106a, and 106b. Ohmic layers 108a, and 108b can be part of the isolated structures 106a, and 106b.

The isolation structure can be on both top or bottom sides (or only one side).

Dielectric layers 110a and 110b can be deposited to cover at least the side of isolated areas 106a, and 106b. The dielectric layers 110a and 110b can cover the side of the layers 112.

Conductive layers 114a, and 114b can be deposited after at least a part of the top of the isolated areas 106a, 106b is open. Passivation layers 116a, and 116b can be formed to fill the surface of the device. Either of the passivation layers 116a or 116b can be covering the side 118 of the device.

A VIA 140 is formed to couple a conductive layer 144 with the electrode 114a. A dielectric layer 142 is covering the sidewall of the VIA 140. An opening 146 in dielectric 142 is formed to provide access to the dielectric 114a. The conductive layer 114c that is filling part of the VIA 140 can be the same as 114a.

Pads 130b and 130a can form on the electrode 114b and conductive layer 144 respectively. The pads can be part of the electrode 114b or 144. The electrodes 114a and 114b can be transparent or reflective.

The VIA 140 can be through the passivation covering the side 118.

Figure 5:
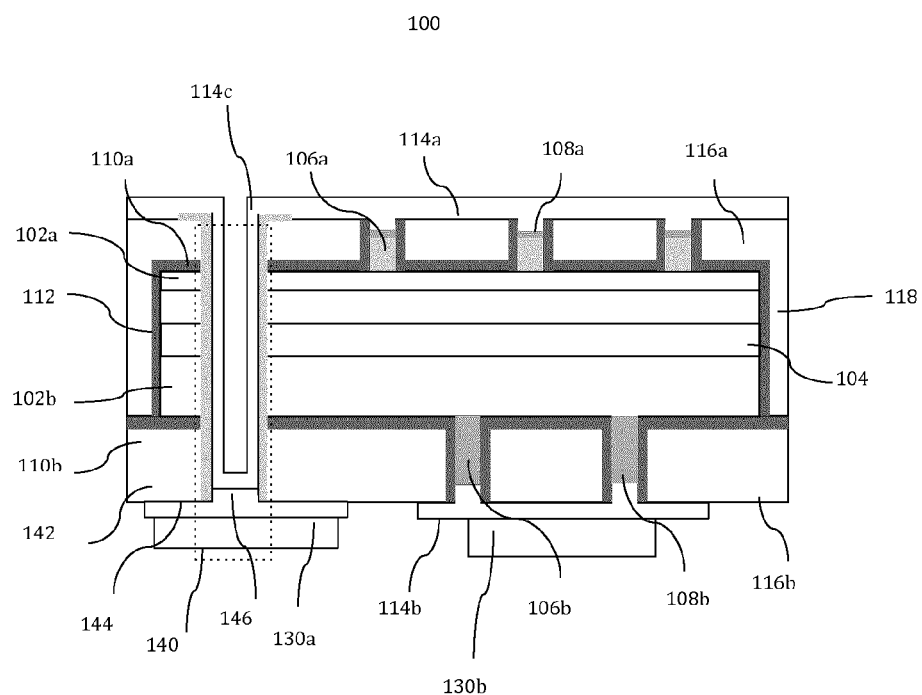
FIG. 5 shows an optoelectronic device with a layered structure having isolated structures with a VIA and conductive layer filling part of the VIA and height differences of isolated structures.

According to one embodiment as shown by FIG. 5 there is a micro optoelectronic device 100 including different layers such as doped and blocking layers 102a and 102b, functional layer 104.

Some of the layers can be etched into isolated areas 106a, and 106b. An ohmic layer 108a, and 108b can be part of the isolated structures 106a and 106b.

The isolation structure can be on both top or bottom sides (or only one side).

Dielectric layers 110a and 110b can be deposited to cover at least the side of isolated areas 106a, and 106b. The dielectric layers 110a and 110b can cover the side of the device layers 112.

A conductive layer 114a, 114b can be deposited after at least a part of the top of the isolated areas 106a, 106b is open. A passivation layer 116a, 116b can be formed to fill the surface of the device. Either of the passivation layers 116a or 116b can be covering the side 118 of the device.

A VIA 140 is formed to couple a conductive layer 144 with the electrode 114a. A dielectric layer 142 is covering the sidewall of the via 140. An opening 146 in dielectric 142 is formed to provide access to the dielectric 114a. The conductive layer 114c filling part of the VIA 140 can be the same as 114a.

Pads 130b and 130a can form on the electrode 114b and conductive layer 144 respectively. The pad can be part of the electrode 114b or 144. The electrodes 114a and 114b can be transparent or reflective.

In one embodiment, the passivation 116a or 116b are taller than the isolated areas 106a or 106b. In one case, to produce the profile, a sacrificial layer is formed on top of the 108a, 108b. After the passivation layer 116a and 116b are formed the sacrificial layer is removed. This can remove the pressure from the isolated area during the integration of the microdevice 100 into a substrate.

The VIA 140 can be through the passivation covering the side 118.

METHOD ASPECTS

The invention also discloses a method to fabricate an optoelectronic device comprising of doped and blocking layers, and a functional layer. The doped, blocking, and functional layers are etched on isolated structures. The isolated structures comprise in part of ohmic layers, and are located on the top and bottom of the device. There are dielectric layers that are deposited to cover at least one side of the isolated structures; as well as conductive layers on open areas of the isolated structures, and passivation layers formed to fill the surface of the optoelectronic device. There are common electrodes formed on top of a planarized layer which connect to the isolated structures. Further, dielectric layers can cover sides of the doped, blocking and functional layers, and the passivation layers cover the dielectric layers. Also, a dielectric layer is deposited to cover an area between the isolated structures, and a sidewall of the isolated structures.

The planarized layer is patterned as such to expose the top of the isolated structures, wherein at least one of the isolated structures may be connected to a second electrode. The second electrode and common electrode have the same bias point. The second electrode and common electrode may have a different bias point as well. Further, the common electrodes on top of the planarized layer connect to the isolated structures and one of the common electrodes is coupled to another side through a VIA formed in the functional and planarization layer. The VIA is formed to couple a conductive layer within the VIA with the electrode coupled due to the VIA and a third dielectric covers a sidewall of the VIA wherein an opening in the third dielectric provides access to the electrode coupled due to the VIA. Pads are formed on the electrode not coupled due to the VIA. Pads may also be formed on the conductive layer.

The electrodes can be transparent or reflective, and the VIA is through the passivation layer. Moreover, the planarization layer is higher than the ohmic layers. The passivation layer is thicker as well as taller than the isolation structures and the planarization layer is a patterned layer with an opening on top of the isolated structures. Further, the VIA is filled with a second conductive layer, which is the same as the previous conductive layer. Lastly, a removable sacrificial layer is formed on top of the ohmic layers.

The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

The invention claimed is:

1. An optoelectronic device, the device comprising:
   doped and blocking layers;
   a functional layer;
   the doped, blocking, and functional layers etched on isolated structures;
   the isolated structures comprising in part of ohmic layers;
   the isolated structures being located on top and bottom of the device;
   common electrodes connected to the isolated structures and on top of a planarized layer higher than the ohmic layer and thicker than the isolated structures such that any pressure to the common electrodes is not directly passed to the isolated structures;
   dielectric layers deposited to cover at least a side of the isolated structures and to cover an area between the isolated structures;
   conductive layers on open areas of the isolated structures; and
   passivation layers formed to cover the dielectric layers and fill a surface of the optoelectronic device.

2. The device of claim 1, wherein the dielectric layers cover sides of the doped, blocking and functional layers.

3. The device of claim 1, wherein a dielectric layer is deposited to cover a sidewall of the isolated structures.

4. The device of claim 1, wherein the planarized layer is patterned to expose the top of the isolated structures.

5. The device of claim 1, wherein at least one of the isolated structures is connected to a second electrode.

6. The dive of claim 5, wherein the second electrode and common electrode have a same bias point.

7. The dive of claim 5, wherein the second electrode and common electrode have a different bias point.

8. The device of claim 1, wherein one of the common electrodes is coupled to another side through a VIA formed in the functional and planarization layer.

9. The device of claim 8, wherein the VIA is formed to couple a conductive layer within the VIA with the electrode coupled due to the VIA and a third dielectric covers a sidewall of the VIA wherein an opening in the third dielectric provides access to the electrode coupled due to the VIA.

10. The device of claim 9, wherein pads are formed on the electrode not coupled due to the VIA.

11. The device of claim 9, wherein pads are formed on the conductive layer.

12. The device of claim 8, wherein the electrodes are transparent.

13. The device of claim 8, wherein the electrodes are reflective.

14. The device of claim 9, wherein the VIA is through the passivation layer.

15. The device of claim 1, wherein the planarization layer is a patterned layer with an opening on top of the isolated structures.

16. The device of claim 15, wherein the passivation layers are taller than the isolated structures.

17. The device of claim 15, wherein the VIA is through the passivation layer.

18. The device of claim 8, wherein the isolation structures are on both top and bottom sides.

19. The device of claim 15, wherein the VIA is filled with a second conductive layer.

20. The device of claim 15, wherein the second conductive layer is the same as the previous conductive layer.

21. The device of claim 19, wherein the passivation layers are taller than the isolated structures.

22. The device of claim 21, wherein a removable sacrificial layer is formed on top of the ohmic layers.

* * * * *